United States Patent [19]

Scott et al.

[11] Patent Number: 5,588,992

[45] Date of Patent: Dec. 31, 1996

[54] CONVERSION OF DOPED POLYCRYSTALLINE MATERIAL TO SINGLE CRYSTAL MATERIAL

[75] Inventors: Curtis E. Scott, Mentor; Mary Sue Kaliszewski, Cleveland Heights, both of Ohio; Lionel M. Levinson, Schenectady, N.Y.

[73] Assignee: General Electric Company, Schenectady, N.Y.

[21] Appl. No.: 552,700

[22] Filed: Nov. 3, 1995

Related U.S. Application Data

[62] Division of Ser. No. 195,187, Feb. 14, 1994, Pat. No. 5,487,353.

[51] Int. Cl.$^6$ .................................................. C30B 1/06
[52] U.S. Cl. ...................... 117/2; 137/3; 137/4; 137/950
[58] Field of Search ............................... 117/1, 2, 3, 4, 117/7, 10, 23, 25, 902, 923, 924, 950; 501/86, 127

[56] References Cited

U.S. PATENT DOCUMENTS

| | | | |
|---|---|---|---|
| 988,230 | 3/1911 | Verneuil | 117/2 |
| 3,026,210 | 3/1962 | Coble | 106/39 |
| 3,564,328 | 1/1971 | Bagley et al. | 313/624 |
| 3,943,324 | 3/1976 | Haggerty | 219/121 L |
| 3,998,687 | 12/1976 | Meiling et al. | 117/2 |
| 4,046,618 | 9/1977 | Chaudhari et al. | 117/8 |
| 4,150,317 | 4/1979 | Laska et al. | 313/221 |
| 4,285,732 | 8/1981 | Charles et al. | 106/57 |
| 4,444,615 | 4/1984 | Matsuzawa et al. | 117/7 |
| 4,519,870 | 5/1985 | Matsuzawa et al. | 117/2 |
| 4,900,393 | 2/1990 | Kugimiya et al. | 117/2 |
| 4,980,236 | 12/1990 | Oomen et al. | 428/469 |
| 5,129,029 | 7/1992 | Uemiya et al. | 385/122 |

FOREIGN PATENT DOCUMENTS

| | | |
|---|---|---|
| 62-021794 | 1/1987 | Japan . |
| 62-28118 | 6/1987 | Japan . |
| 62-278198 | 12/1987 | Japan . |

OTHER PUBLICATIONS

Patent Abstracts of Japan, vol. 8, No. 272; JP–A–59 143255.
Patent Abstracts of Japan, vol. 8, No. 272; JP–A–59 143256.

*Primary Examiner*—Robert Kunemund
*Assistant Examiner*—Felisa Garrett
*Attorney, Agent, or Firm*—Stanley C. Corwin

[57] ABSTRACT

A solid state method of converting a polycrystalline ceramic body to a single crystal body includes the steps of doping the polycrystalline ceramic material with a conversion-enhancing dopant and then heating the polycrystalline body at a selected temperature for a selected time sufficient to convert the polycrystalline body to a single crystal. The selected temperature is less than the melting temperature of the polycrystalline material and greater than about one-half the melting temperature of the material. In the conversion of polycrystalline alumina to single crystal alumina (sapphire), examples of conversion-enhancing dopants include cations having a +3 valence, such as chromium, gallium, and titanium. The polycrystalline body further can be inhomogeneously doped to form a first portion of the polycrystalline body that is doped to the selected level of the conversion-enhancing dopant and a second portion that is not doped such that heating the doped polycrystalline body causes conversion of first portion to a single crystal structure and the second portion retains a polycrystalline structure.

14 Claims, 2 Drawing Sheets

CONVERSION OF DOPED POLYCRYSTALLINE MATERIAL TO SINGLE CRYSTAL MATERIAL

RELATED APPLICATIONS

This is a divisional application of U.S. Ser. No. 08/195,187; filed Feb. 14, 1994 now U.S. Pat. No. 5,487,353.

This application is related to copending applications entitled "Solid State Formation of Sapphire Using a Localized Energy Source", Ser. No. 08/064,386, filed 21 May 1993; and the following applications filed 24 Sep. 1993: "Solid State Formation of Sapphire From Polycrystalline Alumina Using a Seed Crystal", Ser. No. 08/126,628; "Solid State Thermal Conversion of Polycrystalline Alumina to Sapphire", Ser. No. 08/126,954; and "Conversion of Polycrystalline Material to Single Crystal Material Using Bodies Having a Selected Surface Topography", Ser. No. 08/126,830, all of which are assigned to the assignee of the present invention and are incorporated herein by reference.

FIELD OF THE INVENTION

This invention relates to a solid state process for bulk conversion of a polycrystalline ceramic body to a single crystal body by doping the polycrystalline body with a selected dopant in a selected concentration and then heating the doped body to temperatures above one-half the melting temperature of the material but below the melting temperature of the material. More particularly, this invention relates to a solid state process for the bulk conversion of polycrystalline alumina (PCA) to a single crystal alumina (sapphire). The solid state conversion of PCA to sapphire is accomplished by doping the alumina body with a selected dopant in a selected concentration and then heating the doped alumina body to temperatures above 1100° C. but below 2050° C., the melting point of alumina.

BACKGROUND OF THE INVENTION

The manufacture of polycrystalline alumina (PCA), and its use for high pressure sodium arc discharge lamps (hereinafter "HPS lamps")is known in the art. U.S. Pat. Nos. 3,026,210; 4,150,317 and 4,285,732 to Coble, Laska et al and Charles et al, disclose the production of a high density PCA body having improved visible light transmission using relatively pure alumina powder and small amounts of magnesium oxide. U.S. Pat. No. 4,285,732 further teaches adding zirconia and hafnia to the magnesium oxide-doped alumina to reduce the chances of precipitating a spinel phase and exaggerated or run away grain growth during sintering. PCA bodies useful as arc tubes for HPS lamps have been made according to the processes in these patents having an average grain size ranging from between 15 microns to 100 microns.

Two major drawbacks associated with the use of PCA arc tubes for HPS lamps are that they are light translucent as opposed to light transparent and the sodium in the arc reacts with the alumina at the grain boundaries to form sodium aluminate, which adversely affects the structural integrity of the tube and shortens lamp life. HPS lamps are being designed for ever increasing internal sodium partial pressure within the PCA arc tube to improve the color rendition and provide a whiter emitted light. However, higher internal sodium pressure further shortens lamp life due to increased rate of sodium loss from the arc chamber. Progressive sodium loss results in a corresponding continual rise in the lamp operating voltage, a decrease of both correlated color temperature and color rendering index, and a color shift from white to pink. Also, the sodium which migrates through the arc chamber wall deposits on the inside wall of the evacuated outer lamp envelope causing a brownish stain on the envelope which, in turn, further reduces the light output of the lamp. These problems are substantially reduced with sapphire (i.e., single crystal alumina) arc tubes.

Sapphire arc tubes useful as the arc chamber for HPS lamps have been made by a number of processes, including a modified Czochralski process known as the edge-defined, film-fed growth (EFG) process developed by Tyco Laboratories, Inc. This process uses a seed crystal and a die on the surface of molten alumina in which a hollow tube is continuously pulled out of the melt through the die. This process is expensive and slow. Another process used to produce single crystal alumina (sapphire) is called the floating zone process in which a PCA feed rod is introduced at a predetermined velocity into a heating zone wherein one or more lasers or other concentrated heat source is focused on the rod to melt the alumina in the zone to produce a "melt volume" of molten alumina. A sapphire fiber is continuously drawn from the melt volume at the desired velocity and the feed rod is moved simultaneously, but at a slower rate so that the process is a continuous one. This process is used primarily to produce sapphire fibers and does not readily lend itself to production of single crystal alumina tubing, although its use for such is disclosed in U.S. Pat. No. 3,943,324.

Japanese Patent Publication 62-28118 of H. Yoshida et al. discloses that sapphire can be synthesized via a solid state process by inducing a magnesium oxide concentration gradient along the length of a PCA body to ensure grain growth is initiated at a single point on the PCA body during heat treatment. This magnesium oxide gradient can be produced in the PCA body by doping the green body with magnesium oxide in such a way that there is a magnesium oxide gradient in the PCA body, by using a temperature gradient to create the magnesium oxide concentration gradient, or by thinning a section on the greed body. Key to the Yoshida process is that the growth of the single crystal initiates from a single location in the polycrystalline body. Further, it is not known if this process was commercialized and the disclosure, taken at face value, appears to present potential difficulties in its implementation. In particular, Yoshida et al. require only the equivalent of 90 wppm (weight parts per million) magnesium oxide in their alumina starting body. Yet, in order to realize a dense PCA structure, at least about 300 wppm of magnesium oxide is required. See, e.g., J. G. J. Peelen "Alumina: Sintering and Optical Properties", Ph.D Thesis, Technical University of Eindhovan, Netherlands May 1977. Typical alumina densification processes, such as those used to manufacture Lucalox® brand PCA, have 550–750 wppm magnesium oxide in the alumina starting body to ensure that full density is achieved. At 90 wppm of magnesium oxide, a dense, pore-fee structure, specified by Yoshida et al. as their starting material, is not readily achievable.

A need exists for producing sapphire from PCA in a facile and relatively inexpensive manner. It is desirable to fabricate ceramic objects having simple or complex shapes using standard polycrystalline forming techniques and then convert the object into a single crystal body without melting the body. Thus, the single crystal body maintains the shape of the polycrystalline precursor, enabling the fabrication of a great diversity of shapes that are not feasible to fabricate using conventional melt drawing or floating zone techniques. A solid state conversion process would make it possible to manufacture single crystal articles having non-uniform, asymmetric and complex shapes as well as simple shapes. It would also be a great improvement to the art if such a process were cost effective in greatly reducing both the energy and the time required to effect the formation of a single crystal ceramic structure from a polycrystalline ceramic structure.

SUMMARY OF THE INVENTION

In accordance with the present invention, a solid state process for converting a dense polycrystalline body to a single crystal body includes the steps of doping the polycrystalline material comprising the ceramic body with a selected conversion-enhancing dopant and heating the polycrystalline body at a selected temperature for a time sufficient to substantially convert the polycrystalline body to a single crystal body. As used herein, "Solid state process" refers to a process in which the conversion of the polycrystalline body to a single crystal occurs a temperature below the melting temperature of the material such that no pan of the polycrystalline body melts, and no molten zone is formed in the body during the heating steps.

The selected temperature at which the body is heated is less than the melting temperature but greater than about one-half the melting temperature of the polycrystalline material. The polycrystalline material is doped with the selected conversion-enhancing dopant to a selected concentration such that the final dopant concentration in the single crystal body is not greater than the solid solubility of the dopant in the material. For example, selected dopants introduced into polycrystalline alumina (PCA) bodies enhance conversion of the PCA to sapphire in accordance with the process of the present invention. Selected dopants shown to enhance conversion of PCA include materials comprising cations having a +3 valence; examples of such materials include chromium, gallium, and titanium; further, it is anticipated that other materials that form such cations, such as cerium, lanthanum, samarium, and vanadium would similarly enhance such conversion.

Doping of the polycrystalline material can be accomplished in several ways. For example, the dopant is introduced into raw materials used to produce the polycrystalline body; alternatively, the bisque-fired precursor material of the polycrystalline body is immersed in a liquid doping solution having a predetermined concentration of the dopant so that the doping solution infiltrates the bisque-fired body. Infiltration of the bisque-fired body by the doping solution is accelerated by exposing the immersed bisque-fired material to a vacuum.

The method of this invention is particularly adapted for the solid state conversion of polycrystalline alumina (PCA) to sapphire. The selected dopant is introduced into the bisque-fired alumina body, for example, by immersing the bisque fired alumina body in the doping solution in a vacuum chamber and drawing a selected vacuum on the chamber for a selected time. The doped alumina body is then heated; heating of the doped alumina body sinters the bisque-fired body so as to form a dense body, substantially removes many conversion-impeding impurities, such as magnesium oxide (the raised temperature drives off the impurities from the material comprising the ceramic body), and converts the polycrystalline alumina to a single crystal structure (sapphire). The heating step comprises a single heating process in which the body is raised to a selected temperature and maintained at that temperature for a selected time, or alternatively, the heating may comprise separate heating cycles for sintering, removing conversion-impeding impurities, and converting the polycrystalline alumina to sapphire.

In an alternative embodiment, the starting polycrystalline body is inhomogeneously doped such that, on undergoing heat treatment in accordance with this invention, the resulting heat-treated body is a composite material having polycrystalline and single crystal regions (or portions). In this embodiment the polycrystalline body is inhomogeneously doped so as to have a first portion doped with the conversion-enhancing dopant to the selected concentration. A second portion of the polycrystalline body is not doped, or alternatively, doped to a second phase level concentration of the dopant, the second phase level concentration being greater than the solid solubility level of the dopant in the polycrystalline material such that a second phase is formed along grain boundaries of the second portion of the body so as to inhibit conversion of the polycrystalline material to single crystal. The heating of the inhomogeneously doped body produces a composite material body in which the first portion comprises a single crystal structure and the second portion comprises a polycrystalline structure.

Sapphire produced according to the process of this invention is distinguished from sapphire fabricated with more traditional melt processes by the combination of a random pore structure and a unique surface topography in the form of slight undulations having high points at approximately the midpoint of where each PCA grain was located prior to the conversion and depressions corresponding to the where the grain boundaries were located prior to conversion.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description in conjunction with the accompanying drawings in which like characters represent like parts throughout the drawings, and in which:

DETAILED DESCRIPTION OF THE INVENTION

Figure 1:
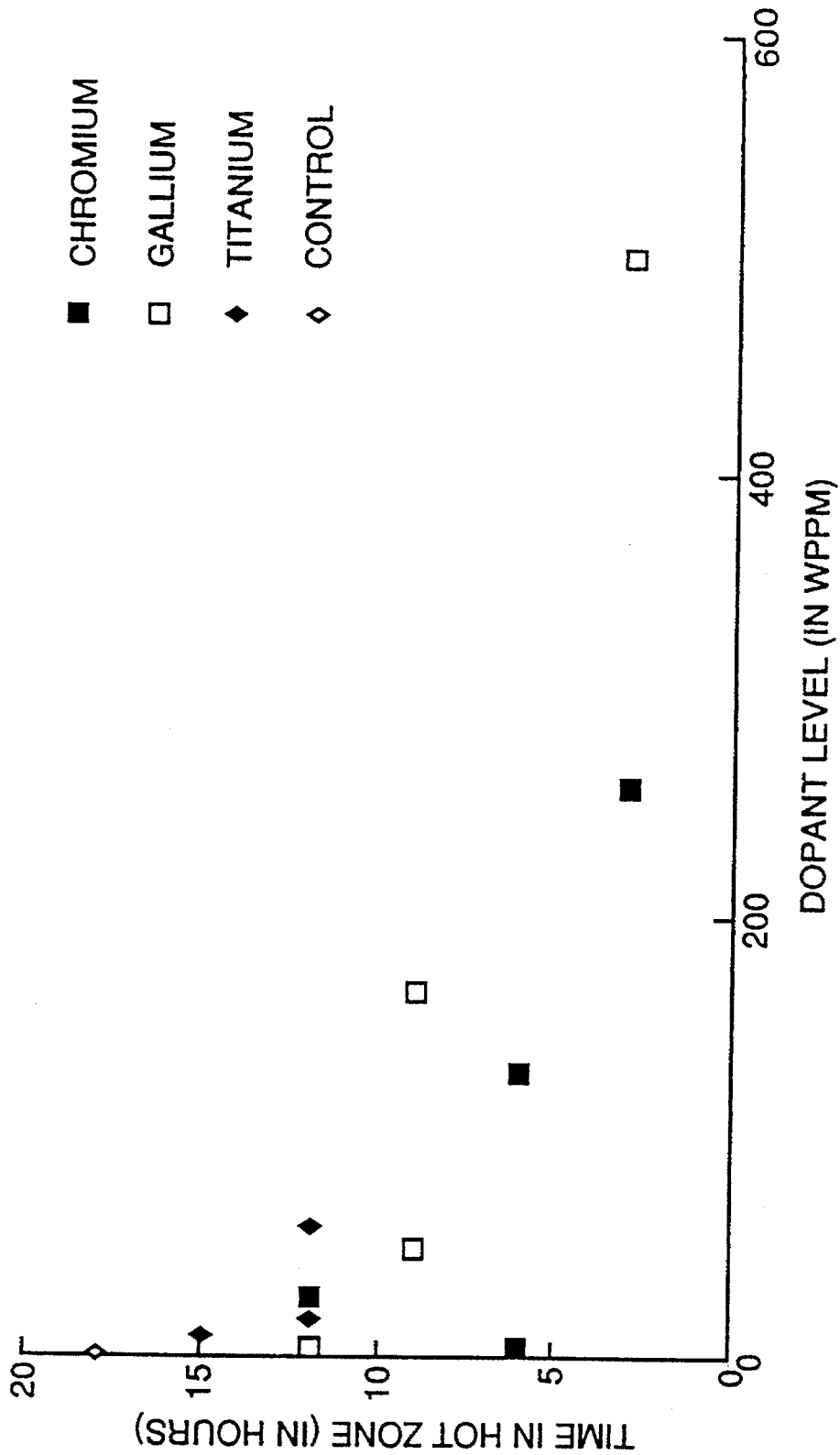
FIG. 1 is a graph illustrating the relationship of dopant level and time of conversion for selected conversion-enhancing dopants in accordance with this invention.

In accordance with the present invention, a polycrystalline body is doped to a selected concentration with a conversion-enhancing dopant and is then heated at a temperature that is less than the melting temperature, but greater than about one-half the melting temperature of the polycrystalline material, for a time sufficient to substantially convert the polycrystalline body to a single crystal body.

A starting material which has been found useful in the practice of this invention, wherein the polycrystalline body comprises polycrystalline alumina (PCA) and the PCA body is converted to single crystal alumina (hereinafter sapphire), is a bisque-fired body of relatively pure alpha alumina having an interconnected pore structure. An interconnected pore structure facilitates uniform penetration of the doping solution throughout the bisque-fired body. The typical starting bisque-fired material has a pore volume ranging from about 15–70%. in general, the starting material is a bisque-fired body composed of 99.9% alumina which can be sintered to densities greater than 3.90 g/cc after doping and is free of impurities of a type and amount that would prevent the conversion of the sintered PCA body to sapphire. When sintered, the bisque-fired body typically produces a PCA material having an equiaxed grain structure with average grain sizes less than 100 microns and preferably less than 70 microns. By grain size is meant the average dimension of a grain as measured by the well known linear intercept technique described in ASTM E112-88. PCA materials with average grain sizes larger than 100 microns tend to form microcracks during the heat treatment of this invention which prevents the conversion to sapphire. The density of the sintered PCA should be at least 3.90 g/cc and more typically greater than 3.97 g/cc as the residual porosity can impede the conversion to sapphire and/or yield a sapphire product having less than optimal light transmittance.

in the production of sapphire in accordance with this invention, the starting bisque-fired material was bisque-fired alumina tubes used for the manufacture of Lucalox® tubes which have outer diameters ranging from 4.5 mm to 8.8 mm and wall thicknesses ranging from 0.5 mm to 0.75 mm. This bisque-fired material is available from General Electric Company, Willoughby Quartz and Ceramic Plant, Willoughby, Ohio (Product #LT5.5-36-PS; Resource #258 23 61). This bisque-fired material typically has a pore volume of 50–60%. When sintered, this material produces a PCA body having densities ranging from 3.97 g/cc to 3.98 g/cc and an equiaxed grain structure with average grain sizes ranging from 15–70 microns. A typical trace impurity analysis for the sintered material (undoped) is given in Table 1 below. The 180 wppm concentration of Magnesium (Mg) is equivalent to about 300 wppm magnesium oxide (MgO).

TABLE 1

| Trace Element | Si | Fe | Ca | Mg | K | Na | Li | Mo | Cr | Cu |
|---|---|---|---|---|---|---|---|---|---|---|
| WPPM Detected | 50 | 4 | 7 | 180 | 50 | 80 | <1 | 10 | 2 | 4 |

Magnesium oxide, typically added to alumina as a sintering aid to obtain a PCA body of densities greater than 3.97 g/cc, has been found to prevent the conversion of PCA to sapphire if present in sufficient quantity. Thus, steps must be taken to lower the magnesium oxide content of the fully dense doped PCA body prior to conversion to sapphire. The level to which magnesium oxide must be lowered can depend on the type and amount of the dopant added. In some cases it has been found that it is necessary to reduce the magnesium content to as low as 50 wppm prior to converting the material to sapphire. Magnesium oxide content was determined using Inductively Coupled Plasma (ICP) analysis. Those skilled in the art know that magnesium oxide can be driven out of a PCA body by heating the body in a vacuum, dry hydrogen, or inert gas containing atmosphere to temperatures above 1600° C. In the process of this invention, this was accomplished by heating the doped Lucalox® brand PCA in an electric resistance furnace to temperatures of 1880° C. for approximately one to nine hours, depending on the part size dopant type, and dopant level, in an atmosphere of dry hydrogen having a dew point below 0° C. Times required to drive magnesium oxide from an alumina body will vary based on starting magnesium oxide content, furnace temperature, furnace atmosphere, and part dimension. Care must be taken during the magnesium oxide volatilization to avoid heating the material for too long as this can result in average grain sizes greater than 100 μm and/or anomalous grain growth.

In accordance with this invention, the bisque-fired starting material is doped to a selected concentration with a conversion-enhancing dopant. As used herein, "conversion-enhancing dopant" refers to a dopant that, when introduced into the polycrystalline material at a concentration as described herein, reduces the time necessary to effect the solid state conversion of the polycrystalline material to a single crystal material during the heating process as discussed below. The selected concentration of the dopant is less than the solid solubility level of the dopant in the polycrystalline material. The selected concentration of conversion-enhancing dopant thus is less than a concentration that will result in the formation of a second crystalline phase in the polycrystalline material. In doping the polycrystalline material, the dopant is typically dispersed in the polycrystalline material such that the concentration of the dopant is substantially homogeneous throughout the polycrystalline material. Based on dopant levels that have been investigated to date, it has been observed that conversion rate (from PCA to sapphire) generally increases as the concentration of the dopant is increased.

For example, a PCA body doped at a selected concentration with chromium, or alternatively with gallium, or alternatively with titanium, has been shown to convert to a single crystal structure body during heating in less time than a similarly-sized undoped PCA body, as set forth in greater detail below. Conversion-enhancing dopants for alumina typically comprise cations having a +3 valence and that exhibit appreciable solid solubility in $Al_2O_3$. "Appreciable solid solubility", as used herein, refers to a material that, when mixed with $Al_2O_3$ at a level below its respective solid solubility limit results in a PCA-to-sapphire conversion rate of practical significance. "Practical significance", as used herein, refers to conversion rates on the order of centimeters per hour, which conversion rates provide sufficient efficiency to make the production of single crystal with that dopant commercially feasible. Typically such a solid solubility of materials exhibiting these characteristics is about 50 wppm or more. For example, the solid solubility levels in $Al_2O_3$ is as follows for the noted conversion-enhancing dopants:

| Chromium | 100% solid solubility |
|---|---|
| Titanium | ~50–100 wppm |
| Gallium | 20–30% by weight |

Other +3 valence cations that may, at a selected concentration, exhibit conversion enhancing properties in alumina include cerium, samarium, lanthanum and vanadium.

In one embodiment of this invention, a bisque-fired polycrystalline material is doped, for example, by immersing the bisque-fired material in a liquid solution of the selected conversion-enhancing dopant. The doping solution typically comprises deionized water with dopant dissolved therein to provide a predetermined concentration of the doping ion. Infiltration of the dopant into the bisque-fired material is further induced, for example, by disposing the bisque-fired material, along with the doping solution in which it is immersed, in a vacuum chamber and drawing a selected vacuum on the chamber for a selected time. After immersion (and the exposure to the vacuum chamber, as appropriate) the doped bisque-fired material is removed and allowed to dry, typically in air, after which it is ready for heating in a furnace to effect the solid state conversion process to a single crystal material.

The bisque-fired body doped to have the selected concentration of conversion-enhancing dopant is then heated to a temperature not greater than the melting point of the material comprising the ceramic body. Additionally, the temperature is typically greater than one-half the melting point of the material comprising the ceramic body. For ceramic bodies comprising alumina as described herein, the PCA body is heated to a temperature greater than 1100° C. but less than 2050° C., the melting point of alumina. No bulk melting of the ceramic is observed during the process of converting the alumina to sapphire, and growth of the single crystal structure is typically initiated from more than one site on the body. Details of the solid state thermal conversion process are contained in co-pending application entitled "Solid State Thermal Conversion of Polycrystalline Alumina to Sapphire," Ser. No. 08/126,954, incorporated herein by reference.

In one example of the process of this invention, bisque-fired alumina tubing comprising Lucalox® brand PCA, as described above and being about 220 mm long, with about a 5 mm outer diameter and a 0.5 mm wall thickness, was doped with chromium in accordance with the following procedure: A doping solution was prepared by dissolving 0.918 grams of chromium (III) nitrate ($Cr(NO_3)_3 \cdot 9H_2O$) in 1 liter of deionized water, which provides a Cr doping ion concentration of approximately 120 wppm. Pieces of presintered alumina tubing, described above, were immersed in about 400 ml of the doping solution. The doping solution with the bisque-fired alumina immersed therein was then placed in a vacuum chamber; a vacuum of about 27" Hg was drawn on the vacuum chamber and maintained for about 30 minutes, after which the doped bisque-fired alumina tubes were removed from the vacuum chamber and the doping solution and allowed to air dry. The resulting concentration of chromium dopant (the conversion-enhancing dopant)in the bisque-fired alumina tubes was about 300 wppm. A similar doping procedure was used to dope bisque-fired alumina tubes having a large outer diameter (8.8 mm).

Fabrication of sapphire from the doped, bisque-fired material involves three basic stages, namely: sintering the material to achieve a dense body (i.e., densities greater than 3.90 g/cc); reducing the magnesium oxide concentration (magnesium oxide being a conversion impeding impurity) in the body below a level that impedes conversion of the material to single crystal; and heating the body to convert the polycrystalline material to a single crystal. In one embodiment of this invention, these three stages are accomplished in multiple heating cycles (that is, raising the temperature of the polycrystalline material in separate processes); the three stages can be accomplished in three respective heating cycles, or alternatively in three or more heating cycles. In another embodiment of the invention, the three stages are accomplished in a single continuous heating cycle in which all three stages occur without removal of the doped polycrystalline body from the furnace used for the heating; in the single heating process there is no clear distinction between the occurrence of the three stages.

In one example of the process of this invention, the three stages of the conversion of PCA to sapphire were accomplished in a single continuous heating process as the three stages could be accomplished using identical furnace conditions. The doped, bisque-fired material was passed in a continuous manner through the hot zone of an electric resistance furnace having a temperature of about 1880° C. and an atmosphere of flowing dry hydrogen having a dew point less than about 0° C. In another example of the process of this invention, the three stages of sapphire fabrication (that is, conversion of the PCA to sapphire) were accomplished using multiple shorter time passes through a furnace having similar conditions to those described above for the continuous heating process. The total time in the hot zone (achieved either in one continuous pass through the furnace or through multiple shorter time passes) necessary to reach 100% conversion is a function of the dopant level, dopant type, starting magnesia level, and body geometry (that is, thicker body dimensions translate into longer times required to reduce MgO content below the level which prevents conversion).

In one example of the process of this invention, alumina tubes doped with chromium (as described above) were exposed to heating in a furnace for the times noted resulting in conversion to sapphire as noted in Table 2:

TABLE 2

| | TIME IN HOT ZONE OF FURNACE (5.0 mm outer diameter tubes) | | | |
|---|---|---|---|---|
| Sample | 3 HRS | 6 HRS | 9 HRS | 12 HRS |
| Cr-Doped Tube (5.0 mm OD) | ~8% conversion | ~68% conversion | 100% conversion | |
| Control Tube (5.0 mm OD) | No sapphire | ~5% conversion | — | ~83% conversion |
| | TIME IN HOT ZONE OF FURNACE (8.8 mm outer diameter tubes) | | | |
| Sample | 6 HRS | 9 HRS | 12 HRS | 15 HRS |
| Cr-Doped Tube (8.8 mm OD) | ~5% conversion | ~47% conversion | ~90% conversion | 100 % conversion |
| Control Tube (8.8 mm OD) | No sapphire | No sapphire | No sapphire | No sapphire |

Examination of the data presented in Table 2 shows that the tubes doped with chromium converted to sapphire in markedly less time than the control (undoped) tubes. The apparent effect of body geometry is also evident as the larger, thicker-walled 8.8 mm OD tubes required longer heating times to convert, most probably as a result of the longer times necessary for the removal of MgO in the thicker parts.

FIG. 1 presents data illustrating the relative effect on PCA-sapphire conversion rate of the following dopants with respect to an undoped control sample: titanium; chromium; and gallium.

In an alternative embodiment of the present invention, variations of the process of this invention can also be used to make a composite material, that is, a body having both single crystal structure and polycrystalline structure regions. Such a composite body is formed by selectively doping portions of a polycrystalline bisque-fired ceramic material and then heating the material as described above to effect conversion of the doped portions of the polycrystalline material. For example, a spiral design was painted down the length of a bisque-fired alumina tube. The doping solution used to paint the design comprised $Cr(NO_3)_3 \cdot 9H_2O$ dissolved in deionized water to yield a solution having a Cr ion concentration of about 120 wppm. The partially-doped bisque fired alumina tube was heat treated according to the process of the present invention described above. Following the heat treatment, the area painted with the Cr dopant solution was converted into sapphire and the unpainted region of the alumina tube remained polycrystalline. No cracking along the interlace between the two regions was observed.

Alternatively, a composite material is formed by selectively doping a first portion of the body with a first concentration of a selected conversion-enhancing dopant and doping a second portion of the body with a second concentration of the conversion-enhancing dopant, the second concentration being greater than the solid solubility limit of the selected conversion-enhancing dopant so as to cause the precipitation of a second phase along the grain boundaries of the second portion of the body. The first and second portions of the polycrystalline body are then heat treated in accordance with this invention as described above so as to convert the first portion of the body to a single crystal structure. The second doped portion of the body, that is, the areas doped to have a dopant level above the solid solubility limit, do not convert due to the presence of the second phase at the boundary of this portion of the body. The first portion of the body, that is, the areas doped at levels lower than the solid solubility limit, convert to a single crystal.

The solid state conversion process in accordance with this invention allows for simple or complex ceramic shapes to be fabricated using standard polycrystalline forming techniques and then converted into a single crystal body without melting the body. Thus, the single crystal body maintains the shape of the polycrystalline precursor, enabling the fabrication of a great diversity of shapes that are not feasible to fabricate using conventional melt drawing or floating zone techniques. Common shapes of alumina materials that beneficially comprise sapphire include fibers (as might be used in fiber reinforced material) or tubes (such as those described above in the demonstration of the method of this invention). Single-crystal lamp parts made from the above-mentioned tubes typically exhibit superior light transmittance characteristics (both total transmittance and forward diffuse transmittance), resulting in increases in lamp efficiency of about 10–15%.

Figure 2:
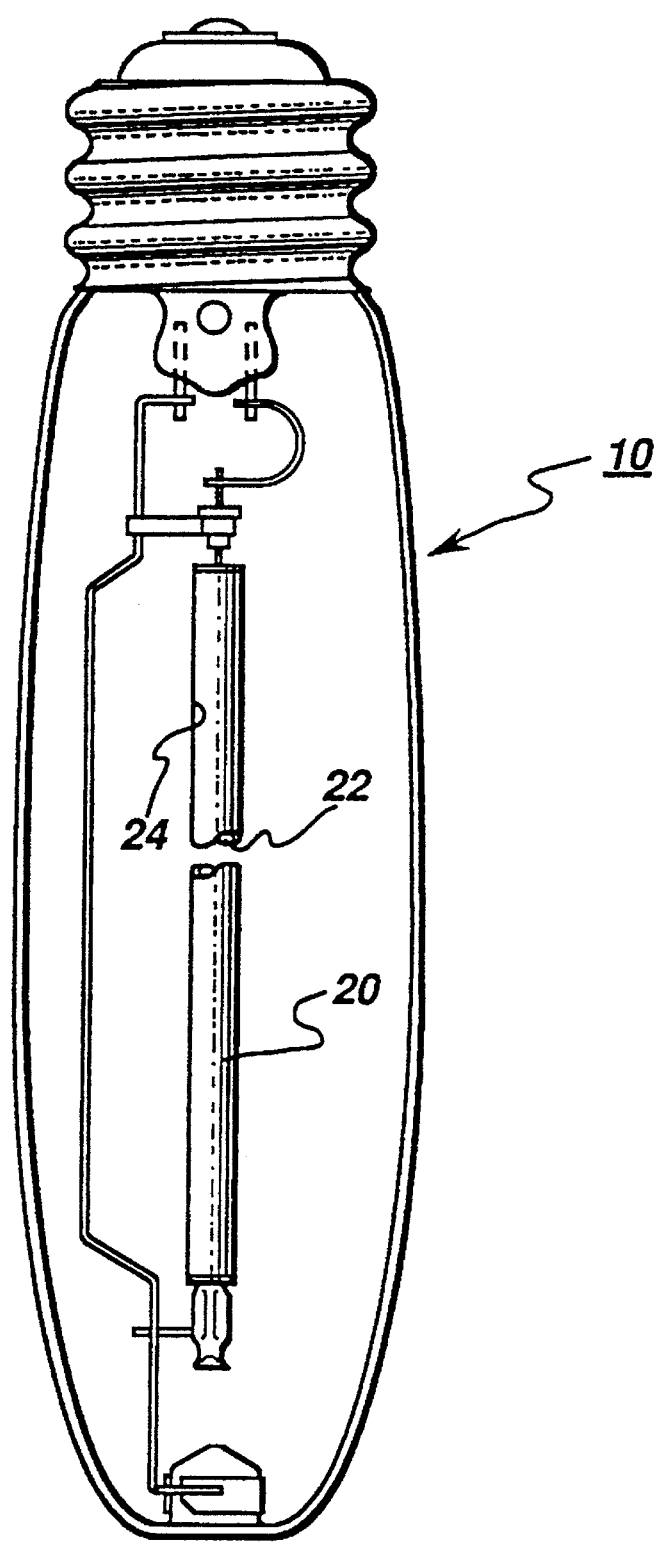
FIG. 2 is a schematic illustration of a high pressure sodium discharge lamp having an arc tube fabricated in accordance with this invention.

Sapphire tubes produced according to the method of this invention are readily formed in the shape of tubes that are adapted for use as arc tubes in high pressure sodium (HPS) lamps. FIG. 2 illustrates an example of an HPS lamp 10 comprising an arc tube 20 fabricated in accordance with this invention. Arc tube 20 is hollow, having an interior surface 22 and an exterior surface 24, and contains the high pressure sodium used for lamp operation. The total and forward diffuse visible light transmittance of a ceramic arc tube fabricated in accordance with this invention provides improved HPS lamp efficiency over that of PCA arc tubes currently in use.

Further, the method of this invention enables tubes (or other shapes of objects) to be made that comprise a first portion having a single crystal structure and a second portion having a polycrystalline structure. Thus it is possible to fabricate an arc tube 20 having an interior surface 22 comprising sapphire and an exterior surface 24 comprising polycrystalline alumina; one advantage of this tube structure is that the interior sapphire surface provides better resistance to sodium attack than does a polycrystalline surface, and the polycrystalline material on the outer surface of the tube provides good strength for the tube. Similarly, if desired, the arc tube can be fabricated so that interior surface 22 comprises polycrystalline alumina and exterior surface 24 comprises sapphire.

Sapphire produced according to the process of this invention is distinguished from sapphire fabricated using melt drawing techniques by the combination of a random pore arrangement and a unique surface topography in the form of slight undulations having high points at approximately the midpoint of where each PCA grain was located prior to the conversion to sapphire and depressed areas corresponding to where the grain boundaries were located prior to conversion. By contrast, sapphire fabricated by many melt-drawing techniques typically exhibits a linear arrangement of porosity resulting from bubbles produced during the drawing process.

While particular embodiments of the present invention are described herein, it is understood that various other modifications will be apparent to and can be readily made by those skilled in the art without departing from the scope and spirit of the invention in its broader aspects. Accordingly, it is not intended that the scope of the claims appended hereto be limited to the description set forth above but rather that the claims be construed as encompassing all of the features of patentable novelty which reside in the present invention, including all features which would be treated as equivalents thereof by those skilled in the art to which the invention pertains.

For example, suitable bisque-fired aluminas other than those used in the production of Lucalox® brand PCA can be used in the practice of this invention. Such materials can be prepared, for example, from alumina powders in accordance with the known methods, with suitable selected dopants introduced at the bisque-fired stage. Example of such known methods of processing alumina powders include the processes disclosed in U.S. Pat. Nos. 3,026,210 and 4,1150,317, both of which are assigned to the assignee herein and incorporated by reference. Alternatively, the dopant material can be introduced into the raw material used to produce the polycrystalline body in the same manner that magnesium is introduced into alumina in accordance with the procedures disclosed in U.S. Pat. Nos. 3,026,210 and 4,1150,317. Starting materials fabricated in either of the above manners, or other similarly efficacious manners apparent to those skilled in the art, should provide suitable starting materials for this process provided the materials meet the requirements of purity, density, grain size, and grain structure previously described.

This process similarly is not restricted to the conversion of PCA to sapphire; any polycrystalline body doped with a selected concentration of an appropriate (that is, a dopant observed to enhance the conversion rate of the particular material in question) conversion-enhancing dopant, if sufficiently pure and pore-free, can be convened to a single crystal form by heating below the melting temperature of the body in an appropriate atmosphere in accordance with the process set out above.

What is claimed is:

1. A solid state process for convening a polycrystalline ceramic body doped with a selected conversion-enhancing dopant at a selected concentration to a single crystal body comprising the steps of:

doping at least a portion of the polycrystalline ceramic material comprising said ceramic body with a conversion-enhancing dopant to a selected concentration; and heating the doped polycrystalline body to a selected temperature to convert the portion of the polycrystalline body doped to said selected concentration to a single crystal structure, said selected temperature being above one-half of the melting temperature of said doped ceramic material but below the melting temperature of said doped ceramic material.

2. A process according to claim 1 wherein the step of doping the polycrystalline ceramic material comprising said ceramic body comprises doping a bisque-fired precursor of said polycrystalline ceramic body with said conversion-enhancing dopant to said selected concentration.

3. A process according to claim 2 wherein the step of doping said bisque-fired precursor comprises immersing said bisque-fired precursor in a liquid solution having a concentration necessary to achieve said conversion of said conversion-enhancing dopant and allowing said dopant to penetrate into said bisque-fired precursor to said selected concentration of dopant in said bisque-fired precursor.

4. A process according to claim 1 wherein the step of doping the polycrystalline ceramic material-comprising said ceramic body comprises the steps of doping a starting powder with a selected level of said selected conversion-enhancing dopant; and processing said starting powder to form said ceramic body.

5. A process according to claim 1 wherein said selected concentration of said conversion-enhancing dopant is less then that concentration which will result in the formation of a second crystalline phase in said polycrystalline material.

6. A process according to claim 1 wherein the step of doping said polycrystalline material further comprises the steps of dispersing said conversion-enhancing dopant homogeneously in said polycrystalline ceramic body.

7. A process according to claim 1 wherein the step of heating said doped polycrystalline body further comprises the steps of:

sintering said polycrystalline body to remove conversion-impeding impurities; and heat treating said polycrystalline body to convert said dense body to a single crystal.

8. A process according the claim 7 wherein the steps of sintering said polycrystalline body, heat treating said polycrystalline body to remove conversion-impeding impurities, and heat treating said polycrystalline body to convert the body to single crystal comprise multiple heating cycles.

9. A process according the claim 7 wherein the steps of sintering said polycrystalline body, heat treating said polycrystalline body to remove conversion-impeding impurities, and heat treating said polycrystalline body to convert the body to single crystal comprise respective distinct heating cycles.

10. A process according the claim 7 wherein the steps of sintering said polycrystalline body, heat treating said polycrystalline body to remove conversion-impeding impurities, and heat treating said polycrystalline body to convert the body to single crystal comprise a single continuous heating cycle.

11. A process according to claim 1 wherein said polycrystalline body is in the shape of a fiber.

12. A process according to claim 1 wherein said polycrystalline body is in the shape of a tube.

13. The process of claim 1 wherein the step of doping at least a portion of said ceramic body with a conversion-enhancing dopant to a selected concentration further comprises doping said a first portion of said ceramic body and not doping a second portion of said ceramic body such that the step of heating said body produces a composite material body comprising a single crystal structure in said first portion and a polycrystalline structure in said second portion.

14. The process of claim 1 wherein the step of doping at least a portion of said ceramic body with a conversion-enhancing dopant to a selected concentration further comprises doping a first portion of said ceramic body with said dopant to said selected concentration and doping a second portion of said ceramic body with said dopant to a second phase level concentration;

said second phase level concentration being greater than the solid solubility level of said dopant in polycrystalline ceramic material such that a second phase is formed along grain boundaries of said second portion of said doped body so as to inhibit the conversion process;

wherein the step of heating of said body produces a composite material body in which said first portion comprises a single crystal structure and said second portion comprises a polycrystalline structure.

* * * * *